United States Patent [19]

Mazzali

[11] Patent Number: 5,036,018
[45] Date of Patent: Jul. 30, 1991

[54] METHOD OF MANUFACTURING CMOS EPROM MEMORY CELLS

[75] Inventor: Stefano Mazzali, Milan, Italy

[73] Assignee: SGS-Thomson Microelectronics S.p.A., Catania, Italy

[21] Appl. No.: 224,102

[22] Filed: Jul. 25, 1988

[30] Foreign Application Priority Data

Jul. 31, 1987 [IT]  Italy ............................ 21536 A/87

[51] Int. Cl.$^5$ ..................................... H01L 21/265
[52] U.S. Cl. ..................................... 437/43; 437/52
[58] Field of Search ................... 437/43, 52; 357/42

[56] References Cited

U.S. PATENT DOCUMENTS

| | | | |
|---|---|---|---|
| 4,317,273 | 3/1982 | Guterman et al. | 437/43 |
| 4,517,732 | 5/1985 | Oshikawa | 437/43 |
| 4,598,460 | 7/1986 | Owens et al. | 437/45 |
| 4,646,425 | 3/1987 | Owens et al. | 437/56 |
| 4,696,092 | 9/1987 | Doering et al. | 437/5 |
| 4,775,642 | 10/1988 | Chang et al. | 437/42 |

Primary Examiner—Olik Chaudhuri
Assistant Examiner—M. Wilczewski
Attorney, Agent, or Firm—Guido Modiano; Albert Josif

[57] ABSTRACT

A method of manufacturing memory cells is described, wherein the great selectivity of polysilicon etching with respect to oxide is employed for the elimination of the self-aligned polysilicon mask for the definition of the floating gate of the EPROM cell. In fact, according to the invention, the mask for the formation of the source and drain regions of one of the CMOS transistors is used for the removal of the oxide separating the two layers of polysilicon on the active region defining a memory cell, and the mask for the formation of the source and drain regions of the other CMOS transistor is employed for the removal of the lower layer of polysilicon around the floating gate of the memory cell, wherein the silicon portions which are not to be removed are covered by oxide.

14 Claims, 5 Drawing Sheets

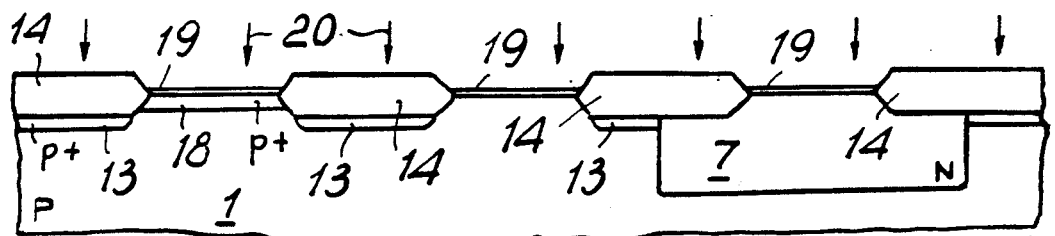
Fig.8 PRIOR ART
Fig.9 PRIOR ART
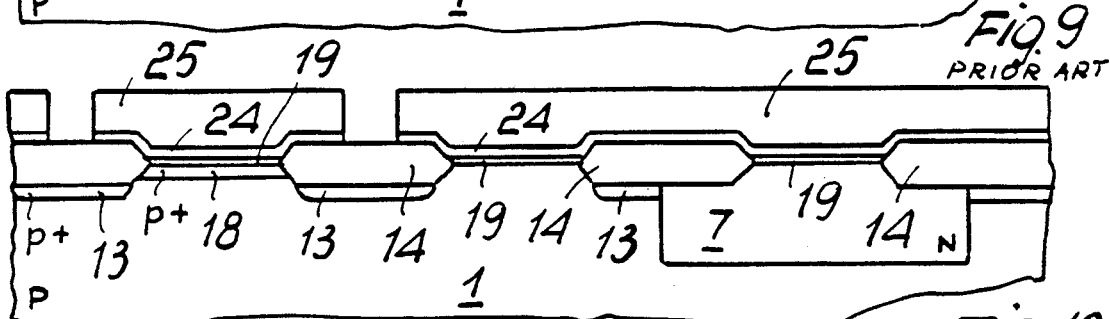
Fig.10 PRIOR ART
Fig.11 PRIOR ART
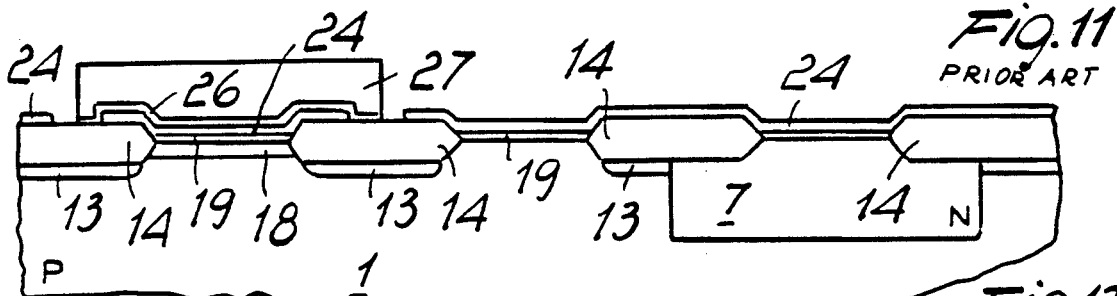
Fig.12 PRIOR ART
Fig.13 PRIOR ART

METHOD OF MANUFACTURING CMOS EPROM MEMORY CELLS

BACKGROUND OF THE INVENTION

The present invention relates to a method of manufacturing CMOS EPROM memory cells. As is known, the manufacture of EPROM memories produced with CMOS technology entails carrying out various process steps, generally comprising the production, in a substrate having a first type of conductivity, of zones having a second type of conductivity, the growth of field oxide regions between the individual transistors, the implantation of atoms in the regions in which the memory cells are to be provided, the formation of a first layer of oxide on the entire surface of the semiconductor body, the adjustment of the threshold of the N- and P-channel devices, the deposition of a first layer of polycrystalline silicon at least on the regions in which the memory cells are to be provided, the deposition of a dielectric layer over the first layer of polycrystalline silicon, the deposition of a third layer of polycrystalline silicon on the entire surface, the formation of a layer of oxide on the second polysilicon layer, and the masking for the definition of the gate regions of the memory cells and CMOS transistors, obtaining the structure illustrated by way of example in FIG. 14. According to the known art, the removal of the layer of surface oxide, of polysilicon and of uncovered oxide is effected for the formation of the gate regions of the transistors. Then a further self-aligned polysilicon masking step is performed for the removal of the portions of the first layer of polysilicon around the floating gate of the memory cells, then, by means of two further masks, the ion implantations for the formation of the source and drain regions of the transistors are performed. Lastly, a final oxidation is effected, followed by the realization of the contacts and metallizations and the deposition of a passivation layer as well as the formation of the contact pads.

Consequently, the method requires a certain number of masking steps which, as known, have a relatively high cost. The need is therefore felt to modify the manufacturing method so as to reduce the overall number of required steps, in particular the number of masking steps and of masks employed.

SUMMARY OF THE INVENTION

Accordingly, the aim of the present invention is to provide a method of manufacturing EPROM memory cells with a CMOS process which reduces the number of manufacturing steps, and in particular, the masking steps required for the production of the individual transistors constituting the EPROM cells and the CMOS devices.

Within this aim, a particular object of the present invention is to provide a method of manufacturing CMOS EPROM memory cells which, while reducing the number of masking steps, does not entail an increase in the number of further process steps required for the production of individual transistors.

Still another object of the present invention is to provide a method of manufacturing CMOS EPROM memory cells which comprises manufacturing steps which are per se known and already used in the production of integrated devices, so as to allow the use of machines commonly employed in the electronics industry.

Not least object of the present invention is to provide a method of manufacturing CMOS EPROM memory cells having electric characteristics which are comparable or even improved with respect to those of the devices produced according to known processes.

This aim, the mentioned objects and others which will become apparent hereinafter are achieved by a method of manufacturing CMOS EPROM memory cells, according to the invention, as indicated in the accompanying claims.

BRIEF DESCRIPTION OF THE DRAWINGS

The characteristics and advantages of the invention will become apparent from the description of a preferred but not exclusive embodiment, illustrated only by way of non-limitative example in the accompanying drawings, wherein:

FIGS. 1 to 14 are transverse sectional views through a silicon wafer, illustrating the first known process steps for manufacturing an EPROM memory with CMOS technology;

DESCRIPTION OF THE PREFERRED EMBODIMENTS

For a better understanding of the advantages obtainable with the method according to the invention, a known process for the production of EPROM memory cells and CMOS transistors is first described, and in the particular case the sequence of the Assignee's CMOS E3 method is described, wherein the polysilicon layer of the driving transistors (or other structures not comprised in the memory matrix) is constituted by the superimposition of two polysilicon layers, with removal of the dielectric separating them ("Double-Poly-Short-Circuit DPSC" process), with dielectric formed by an ONO (silicon oxide-nitride-oxide) layer and with drain extension.

The fact is stressed that, for the sake of clarity, the thicknesses of the various layers and the dimensions of the different areas are not in the same scale.

Figure 1:
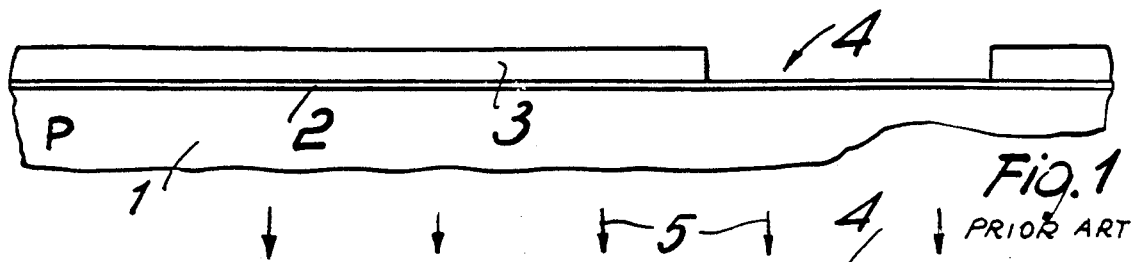
Figure 2:
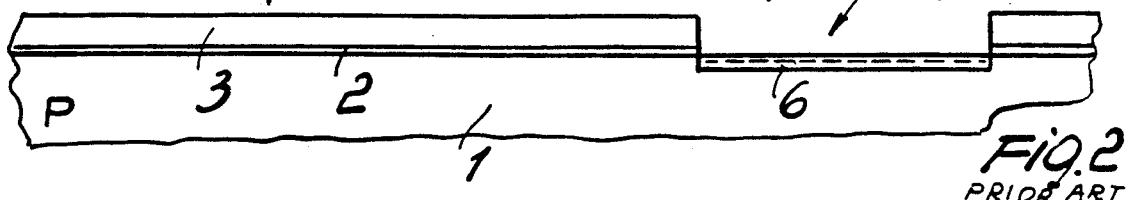
Figure 3:
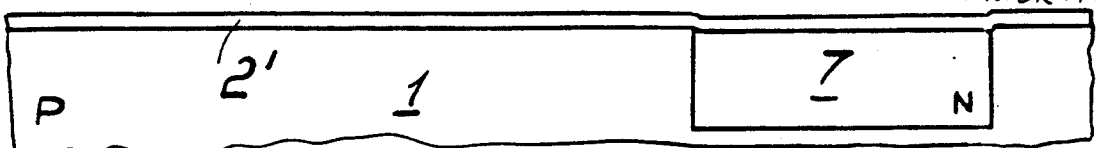
Figure 4:
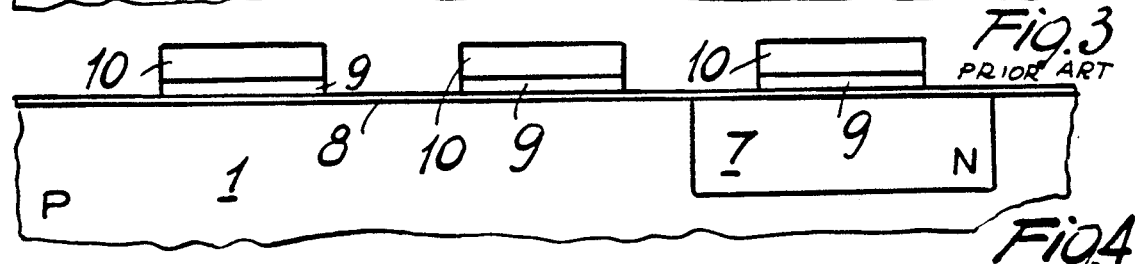
Figure 5:
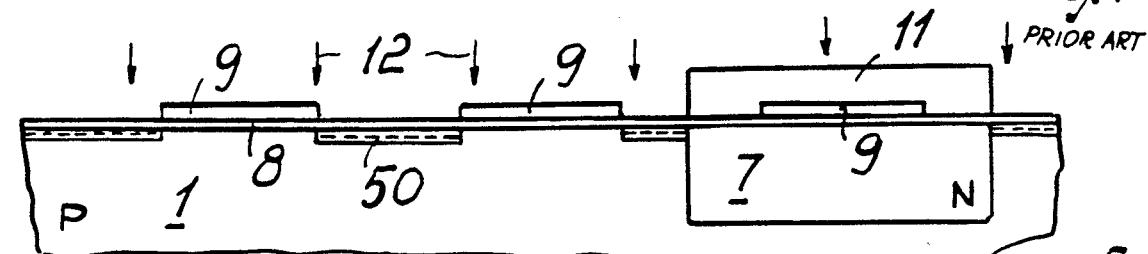
Figure 6:
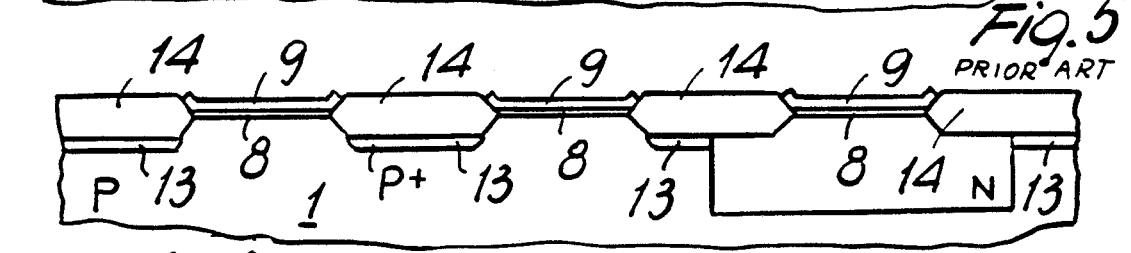

Reference should thus initially be made to FIG. 1, wherein an initial structure is illustrated, constituted by a substrate 1 formed by an epitaxial layer with P-type conductivity with orientation [100] and resistivity 28–37 $\Omega$/cm. After an initial oxidation, leading to the growth of an oxide layer 2 with a thickness of 1700 Å, the mask 3 is made, with windows 4 for the formation of zones with N-type conductivity for the obtainment of one of the two transistors of CMOS structures. The structure of FIG. 1 is then subject to a step of chemical etching for the removal of the uncovered portion of the oxide 2, after which the implantation of phosphorus is effected through the window 4, as indicated in FIG. 2 by the arrows 5, leading to the accumulation of phosphorus ions in the thin layer 6 of FIG. 2. The masking resist is then removed and the diffusion of the N zone is performed in an oxidating environment, leading to the structure of FIG. 3, wherein the reference numeral 7 indicates the N zone, while 2' indicates the simultaneously grown surface oxide layer. Then the surface oxide layer 2' is removed and the reoxidation of the structure is performed, leading to the growth of an oxide layer 8 (FIG. 4) with a thickness of 100 Å. Then the nitride is deposited, with the formation of a layer 9 with a depth of 1900 Å. Then the active-region mask, comprising portions of resist 10 covering the active regions of the memory cells and those of the CMOS transistors and having windows at the regions in which insulation regions with P+ type conductivity are to be provided, is deposited by means of ordinary lithographic methods. Then the uncovered portions of the nitride layer 9 are removed, thus obtaining the structure shown in FIG. 4. Then the mask 10 is removed and the P+ insulation mask is applied, covering the N zones 7 and having windows at the memory cell matrix and at the N-channel transistors formed in the substrate. Then, by using the resist mask 11 and the nitride portions 9, the insulation boron is implanted (as indicated in FIG. 5 by the arrows 12), the implantation energy being selected so that the implanted atoms do not pass through the nitride portions 9 left uncovered by the resist. Consequently the thin layer 50 accummulates the boron ions, as shown in FIG. 5. Then the mask 11 is removed, and the structure is subjected to thermal treatment for the diffusion of the insulations, with the formation of the layers 13 and the production of the field oxidation, leading to the formation of the field insulation regions 14, having a depth of 7000 Å. The structure thus obtained is shown in FIG. 6.

Figure 7:
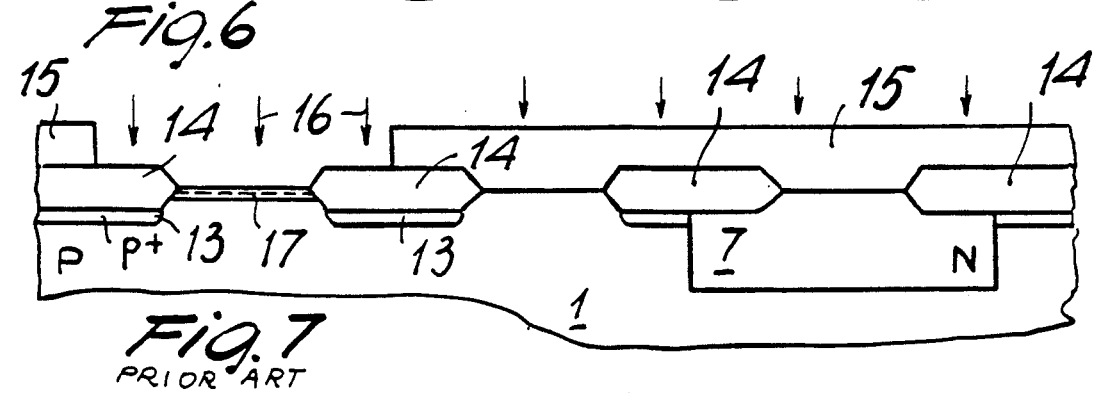

This structure then undergoes a chemical etching step to remove the oxide layer formed on the regions 9 and then a chemical nitride etching step to remove said regions 9. Successively, the structure is again masked for the deposition of the EPROM mask 15, which has windows at the region where the EPROM cells are to be formed. Then the implantation of boron is effected for adjusting the threshold of the memory cells, as indicated in FIG. 7 by the arrows 16, and boron ions accumulate in the thin layer 17. The masking resist 15 and the oxide layer 8 are then removed, and a gate oxidation is performed, leading to the growth of an oxide layer having a thickness of 330 Å, indicated by the reference numeral 19 in FIG. 8, and then an implantation of $BF_2$ is effected directly onto the surface of the wafer, without a resist mask (blanket implantation), as indicated in FIG. 8 by the arrows 20, to adjust the threshold of the P-channel devices. In this figure, 18 indicates the P+ region constituting the EPROM memory cell. Then the adjustment of the threshold of the N-channel transistors is performed by means of an appropriate resist mask (indicated by the reference numeral 21 in FIG. 9) covering the substrate at the regions of the memory cells and the P-channel transistors to be formed in the N zones. Then the implantation of boron is performed, as indicated in FIG. 9 by the arrows 22 and by the thin layer 23 which indicates the accumulation of boron ions.

The mask 21 is removed, and a first layer of polycrystalline silicon 24 having a depth of 1500 Å is deposited on the preceding structure. The layer 24 is then doped with $POCl_3$ and the mask of the first polysilicon layer, indicated in FIG. 10 by the reference numeral 25, is deposited. Then the uncovered portions of the polysilicon layer 24 are removed by chemical etching, thus obtaining the structure shown in FIG. 10.

The resist mask 25 is then removed and a triple layer of ONO dielectric is produced by surface oxidation of the polysilicon layer 24, deposition of a nitride layer with a depth equal to 400 Å and nitride oxidation. Consequently, as shown in FIG. 11, there is a layer of ONO dielectric 26 above the polysilicon layer 24 and the field oxide in the regions where the poly-silicon layer 24 has been removed.

Then a layer of polysilicon having a depth of 500 Å is deposited, a step of removal by chemical etching of the polysilicon and of the nitride from the rear is performed, the mask of the matrix which covers the memory cells is deposited and the PONO (Polysilicon-Oxide-Nitride-Oxide) layer is removed for the removal of the dielectric in the driving region, wherein the CMOS transistors are to be provided. This step is visible in FIG. 12, wherein the reference numeral 27 indicates the resist of the matrix mask and wherein the PONO etching has already been performed.

The mask 27 is then removed and a second layer of polycrystalline silicon, having a depth of 4000 Å, is deposited. This layer, indicated in FIG. 13 by the reference numeral 28, is separated from the first polysilicon layer 24 by means of the dielectric 26 at the memory cells, but forms a single layer with the first polysilicon layer 24 in the region where the transistors not comprised in the memory matrix are to be produced, and is indicated here at 24+28. Then the polysilicon layer 28 is doped with $POCl_3$ and a layer of vapor-phase oxide (vapox or Silicon-Glass, SG) with a depth of 2000 Å is deposited. This vapox layer is shown in FIG. 13 and is indicated by the reference numeral 29.

Figure 14:
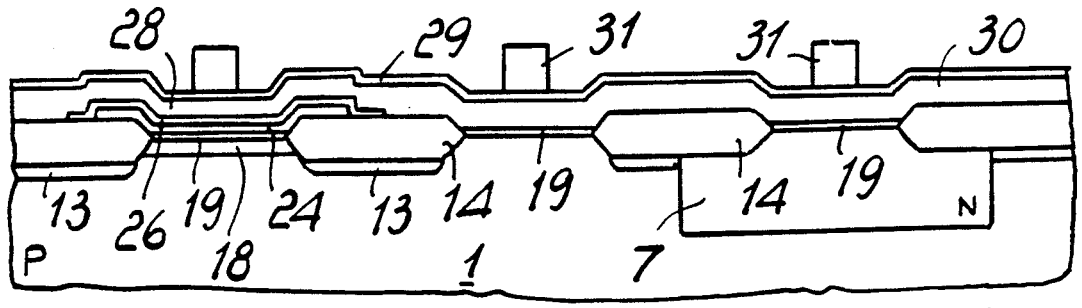

Successively the mask for the definition of the gate regions in the memory cells and of the driving transistors or of the transistors in any case not belonging to the memory matrix (Poly 2 mask) is deposited as illustrated in FIG. 14, wherein the reference numeral 31 indicates the portions of resist deposited on the oxide 29 at the gate regions to be formed.

Figure 15:
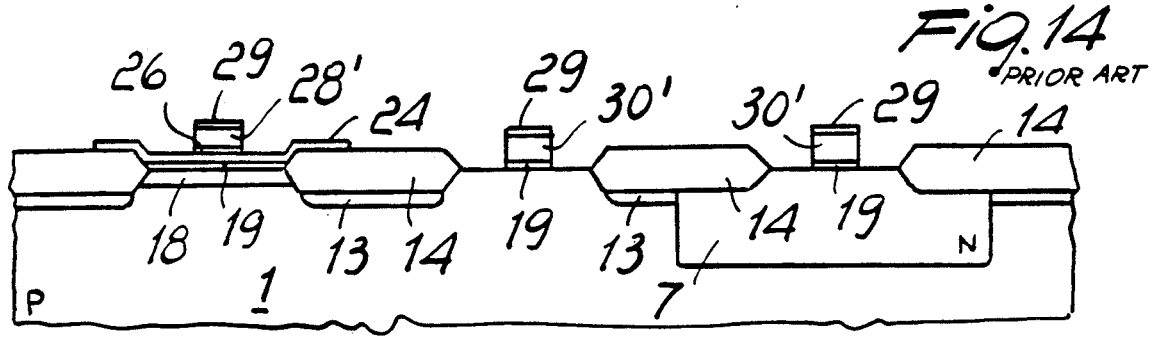
FIGS. 15 to 19 are further transverse sectional views through a silicon wafer, illustrating further steps of the known process for the production of the floating gate and the source-drain regions of MOS transistors.

Then a first etching of the vapox is performed, removing the uncovered vapox layer, then the remaining, uncovered polysilicon layer is in turn removed (i.e. the second polysilicon layer 28 at the regions of the memory cells and the composite layer of polysilicon—hereinafter indicated by the reference numeral 30 for the sake of simplicity—at the driving transistors is removed), so as to leave portions 28' and 30' respectively forming the control gate regions of the memory cells and of the driving transistors. Then, according to the known art, the ONO dielectric layer is removed except in the area covered by the region 28', and the thermal oxide layer 19 overlying the active regions of the P-channel and N-channel transistors is simultaneously removed except for the areas covered by the regions 30' (i.e. below the gate regions). Then the Poly 2 mask is removed, thus obtaining the structure shown in FIG. 15.

Figure 16:
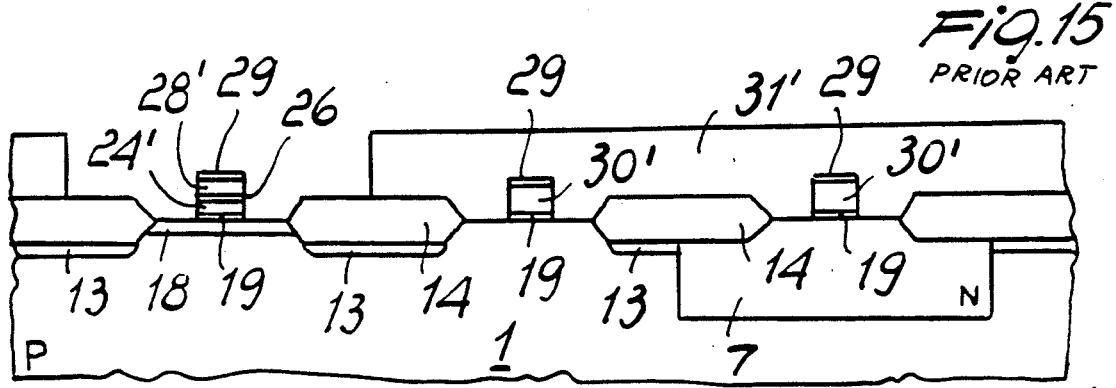

According to the known art, a further masking step is performed for the obtainment of the floating gate of the memory cells. For this purpose a mask of self-aligned poly, constituted by a layer of resist 31' is deposited to cover the entire surface of the structure except the regions of the memory cells, the uncovered portions of the first polysilicon layer 24 are removed, thus obtaining the floating gate region indicated at 24' in FIG. 16, and then chemical etching is performed to effect the removal of the oxide layer 19 deposited on the substrate. The structure of FIG. 16 is thus obtained.

Figure 17:
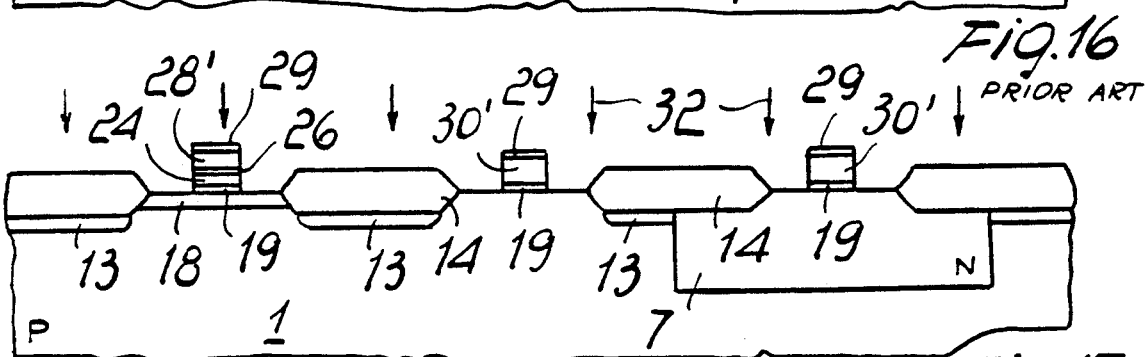

After removal of the mask 31, the drain-extension phosphorus is implanted as indicated in FIG. 17 by the arrows 32.

Figure 18:
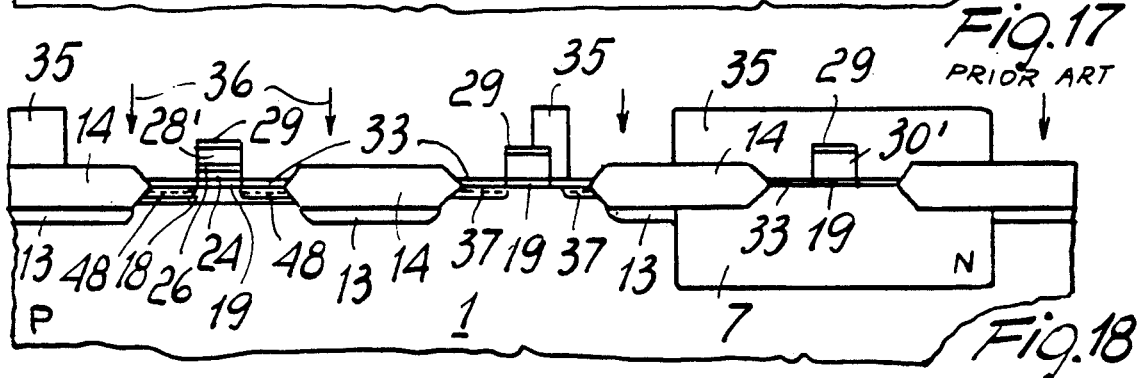

Then a reoxidation step is performed, leading to the growth of a layer 33 above the uncovered portions of silicon (on the active regions of the devices not covered by the gate regions). Then the N+S/D+drain-extension mask is deposited for the implantation of atoms adapted to constitute the N+source and drain regions. Consequently, a layer of resist 35 is located over the areas which are not to be implanted, in particular above the region of the zone 7 wherein the P-channel transistor is to be provided. Then the implantation of source-drain arsenic is effected, as indicated in FIG. 18 by the arrows 36. Thus, the accumulation of arsenic ions occurs at the free portions of the substrate, as indicated in FIG. 18 by the broken lines of the thin layers 37 and 48.

Then the resist of the mask 35 is removed and recrystallization annealing is performed. The P+S/D mask is then deposited for the doping of the regions which are to form the source and drain regions of the P-channel transistors to be formed in the zones 7, and possibly to form further implanted regions with P+-type conductivity. Thus, one obtains the mask shown in FIG. 19 and indicated by the reference numeral 40, covering the memory cells and the complementary N-channel transistors. A boron implantation is then effected on the uncovered regions for the formation of the source and drain regions, as indicated in FIG. 19 by the arrows 39, leading to thin layers 42 to form inside the zone 7.

Figure 28:
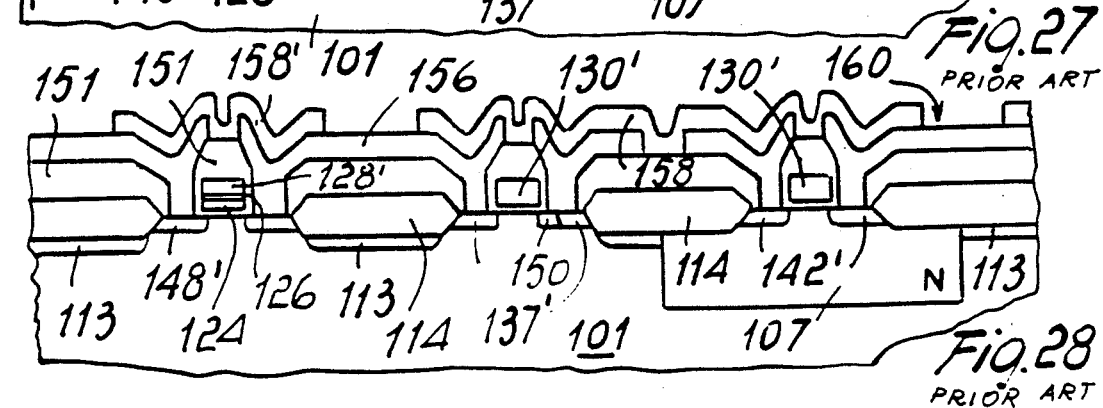

The method continues with the final reoxidation and diffusion of the implanted impurities for the formation of the source and drain layers, with the deposition of vapox and insulation BPSG (Boron-Phosphorus-Silicon-Glass, i.e. vapox doped with boron and phosphorus), followed by the reflow, the masks of the contacts, the sputtering ion vaporization of the metallic layer, the metal masking for the connections, the metallic alloying, the deposition of the final vapox and the pad masking, thus obtaining the structure of FIG. 28.

Figure 19:
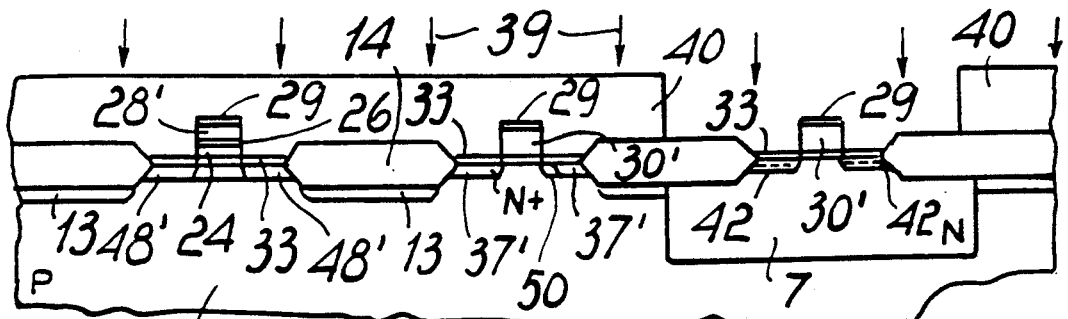

Therefore, according to the method described above, which has a sequence of method steps which generally corresponds to current EPROM CMOS methods (which may vary with respect to the described method in the manner of manufacturing the polysilicon layer of the driving transistors—method with or without DPSC—, for realizing the drain extension and for the type of dielectric employed between the two polysilicon layers—oxide or ONO or other dielectric—), the method steps illustrated in FIGS. 14-19 (for the definition of the control gate regions of the memory cells, the CMOS transistors, the floating gate, the memory cells, and for the production of the drain and source regions of the individual transistors) require four masks, and precisely the Poly 2 mask of FIG. 14, the self-aligned Poly mask shown in FIG. 16, the N+ mask shown in FIG. 18, and the P+mask shown in FIG. 19.

The method according to the invention, which is illustrated hereinafter, instead allows the definition of the gate regions of the individual transistors, the floating gate, the memory cells, and the source and drain regions of the transistors, by means of only three masks, without increasing the number of process steps.

Figure 20:
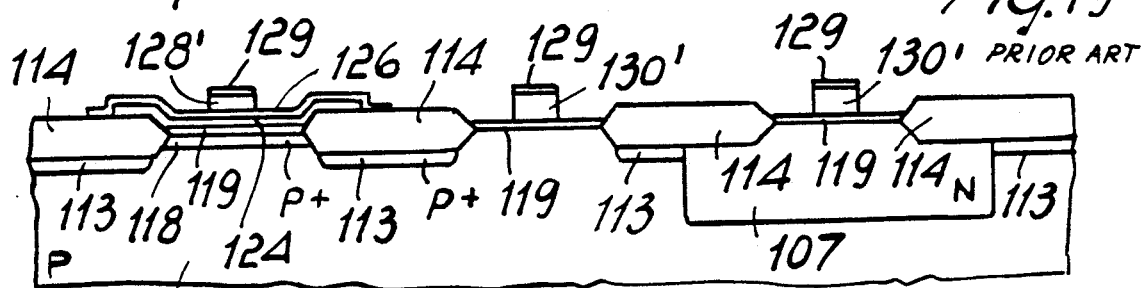
FIGS. 20 to 22 illustrate steps of the method according to the invention, corresponding to steps 15 to 19 of the known process.

According to the invention, the method provides a first part which is common to the known method, and precisely up to the obtainment of the structure shown in FIG. 14, comprising a substrate 1 with a first type of conductivity (e.g. P), of the zones 7 with opposite conductivity (e.g. N) wherein there must be provided the P-channel transistors of the pairs of CMOS transistors, the insulation regions 13, the field oxide regions 14, the doped regions 18 with P++conductivity of the memory cells, the thermal oxide layer 19, the first polysilicon layer 24, the ONO layer 26, the second polysilicon layer 28, the composite polysilicon layer 30, and the surface vapox layer 29 with the mask 31 covering the regions in which the gate regions are to be provided. According to the invention, therefore, this structure, shown in FIG. 14, is subjected to, as in the known art, a first etching of the uncovered vapox layer 29 and the etching of the uncovered polysilicon layer 28, 30. Differently from the known art, according to the invention at this point no etching of the uncovered oxide is performed which etching, according to the known art, led to the removal of the uncovered portions of the ONO layer 26 and of the thermal oxide 19, but the Poly 2 mask is removed immediately after the etching of the polysilicon layer. According to the invention, the structure shown in FIG. 20 is therefore obtained, wherein the parts corresponding to those obtained according to the known art are indicated with reference numerals obtained by adding 100 to the reference numerals used in FIGS. 1 to 19.

Figure 21:
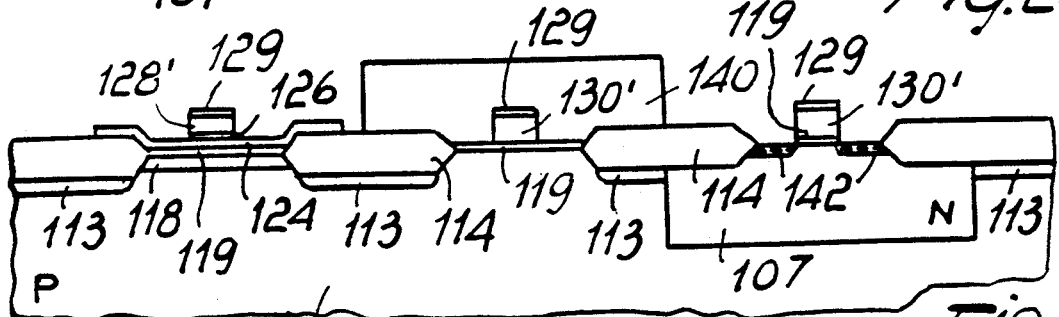

Subsequently, as shown in FIG. 21, the P+mask is deposited for the implantation of the boron ions adapted to form the source and drain regions of the P-channel transistors to be formed in the zones 107. In this case the P+mask comprises resist portions 140 which cover the regions wherein the N-channel devices formed in the substrate are to be provided, but leave uncovered the regions of the memory cells, which are screened by the polysilicon layer 124 and by the ONO layer 126. Then the S/D implantation of boron in the N zone is effected, leading to the accumulation of boron ions in thin layers indicated by the reference numeral 142 in FIG. 21. Then a physical-chemical etching of a unidirectional type (Reactive Ion Etching) is performed for the removal of the uncovered ONO layer 126, obtaining the structure of FIG. 21.

Figure 22:
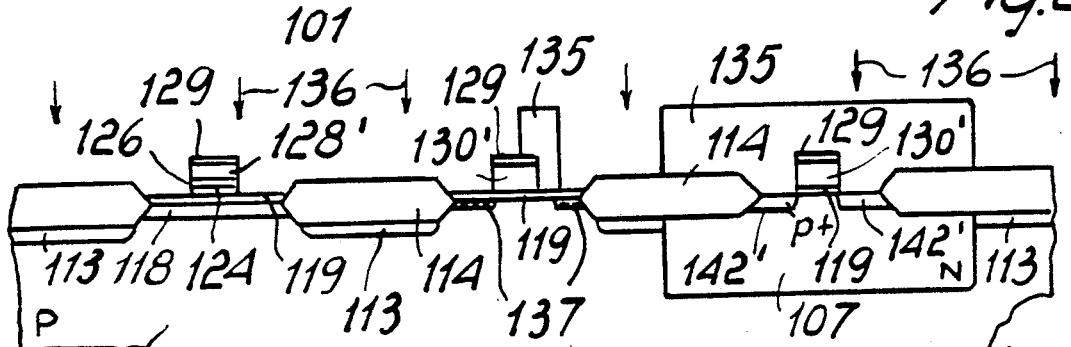

Then the resist of the mask 140 is removed and the N+S/D+drain-extension mask, having resist portions 135 covering the regions which are not to be implanted with arsenic, is deposited. This mask, as can be seen in FIG. 22, covers the region of the zones 107 and portions of the active region of the complementary N-channel transistor. Using this mask, an etching of the uncovered polysilicon layer is initially performed, leading to the removal of part of the layer 124 and thus defining the floating gate of the memory cells. Subsequently, if required, the removal of the gate oxide (uncovered portion of the oxide 119) is effected and then the arsenic is implanted for the formation of the source and drain regions of the N-channel transistors (with accumulation of arsenic ions in the thin layers 137) and the memory cells (layers 148). This implantation is indicated in FIG. 22 by the arrows 136.

By removing the resist mask 135, the same structure resulting from the removal of the mask 40 of FIG. 19 is thus obtained, except for the drain-extension implantation, not shown, which can however be performed at a different moment, e.g. after the removal of the resist of the Poly 2 mask (on the structure of figure 20) or after the removal of the resist 140 on the structure of FIG. 21 or after the removal of resist 135 on the structure of FIG. 22. Furthermore, the reoxidation can be performed for example on the structure of FIG. 20, after the removal of the resist of the Poly 2 mask, since no oxide grows on the nitride of the memory cells (layer 126), or after the removal of the mask 135 on the structure of FIG. 22 as final reoxidation and diffusion of the junctions, before the deposition of the vapox and the BPSG.

The structure of FIG. 22, completed by the phosphorus implantation of for the drain extension and by the reoxidation, executable as mentioned above, is then subject to the final method steps, as already indicated with reference to the known process, for the completion of the finished device.

Figure 23:
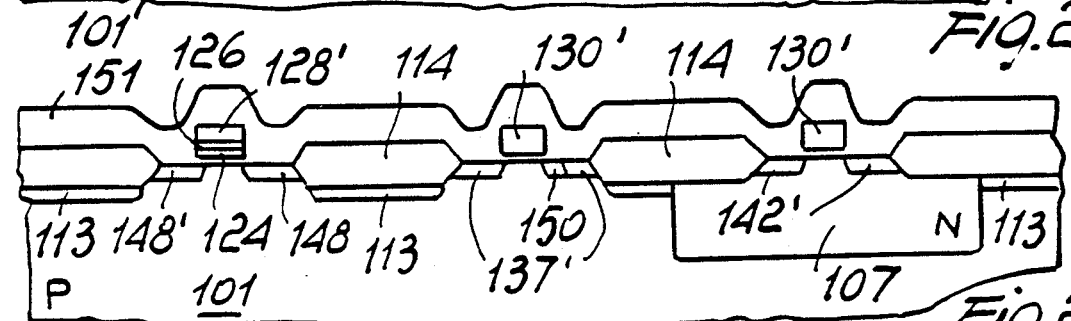
FIGS. 23 to 28 illustrate successive process steps which are common both to the known art and to the invention.
Figure 24:
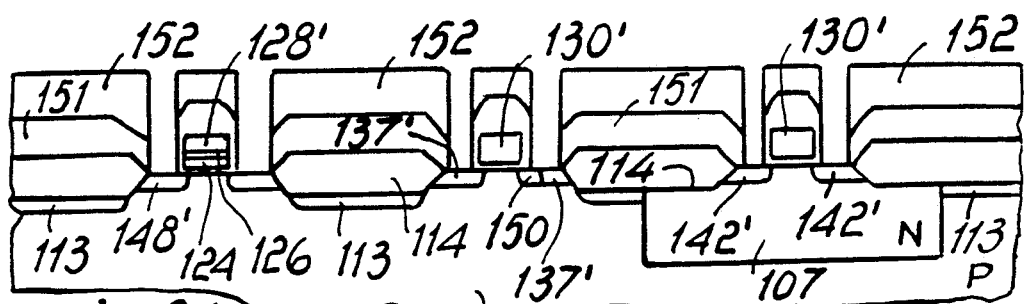
Figure 25:
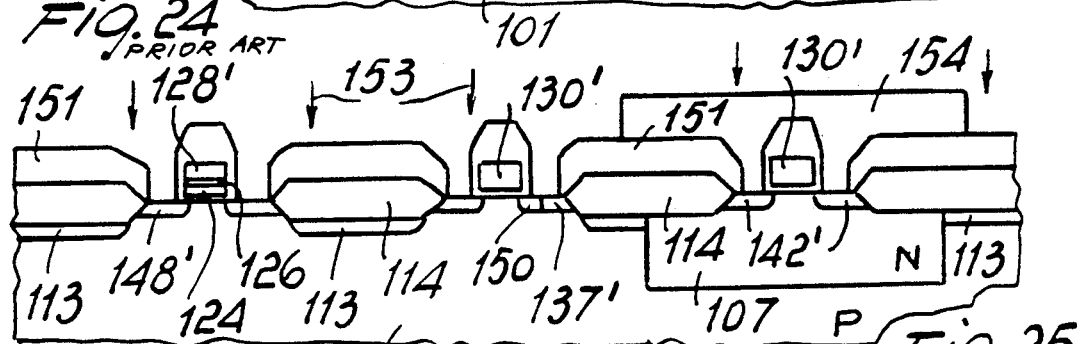
Figure 26:
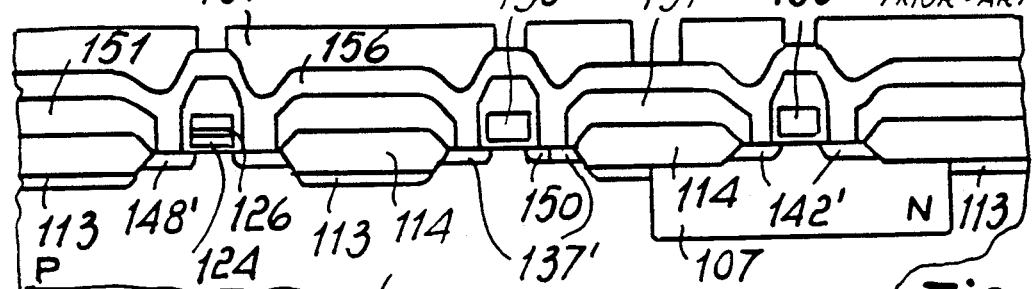

These conclusive steps, illustrated schematically in FIGS. 23 to 28, comprise, after said phosphorus implantation for drain extension and after reoxidation, both not illustrated, the deposition of 4000 Å of vapor-phase oxide (VAPOX), the deposition of 4000 Å of BPSG and the reflow of the BPSG. The structure of FIG. 23 is thus obtained, wherein the regions of FIG. 22 are covered by the composite oxide layer 151, and wherein there are also indicated the drain and source regions 137' of the N-channel transistor in the substrate, the drain-extension region 150, doped less heavily than the regions 137', and the source and drain regions 148 of the memory cell, formed as a consequence of the drain-extension implantation in the region previously indicated by the reference numeral 118. Then the contact mask, indicated by the reference numeral 152 in FIG. 24, is deposited and a unidirectional physical-chemical etching is then performed for the removal of portions of the oxide layer 151 for the formation of the contacts. After the removal of the contact mask 152, a mask 154 is deposited for the implantation of phosphorus at the regions with N-type conductivity adjacent to the contacts. Then the implantation of phosphorus in the contacts is effected, as shown schematically in FIG. 25 by the arrows 153. Then the mask 154 is removed, an annealing step for crystallization is performed in an oxidating atmosphere, the etching of the oxide in the contacts is performed, a metallization layer with a thickness of 9000 Å, indicated at 156 in FIG. 26, is deposited, and a mask for the shaping of the metallization, indicated at 157 in FIG. 26, is then deposited.

Figure 27:
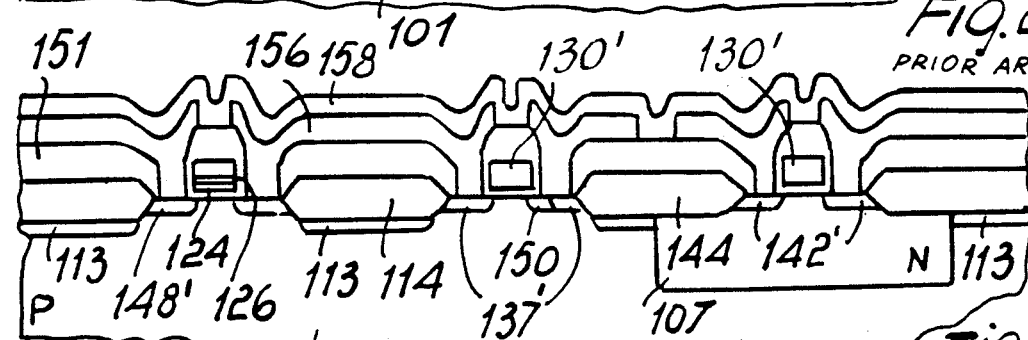

Unidirectional chemical-physical etching of the uncovered portions of the metallic layer is then performed, the masking resist 157 is removed, the aluminum alloy is formed, and a layer of 7000 Å of final P-VAPOX (i.e. vapor-phase oxide doped with phosphorus) is deposited. The structure thus obtained is shown in FIG. 27, wherein 158 indicates the P-VAPOX layer. Then a further mask is deposited for the shaping of the P-VAPOX layer, the masking resist layer is removed, thus obtaining the structure of FIG. 28, wherein the remaining P-VAPOX layer is indicated at 158' and 160 indicates a contact pad. Finally, the lapping of the rear, the evaporation of 0.3 microns of gold and the gold alloying are performed.

In practice, according to the invention, only three masks are used for the definition of the gate regions and of the source and drain regions of the individual transistors, and precisely the mask 31 shown in FIG. 14 and common to the known process, the P+mask 140 and the N+mask 135. In fact, by exploiting the "great" selectivity of polysilicon etching with respect to oxide, the etching for the definition of the floating gate is performed by using the N+mask and by exploiting the screening effect of the oxide 119, thus eliminating the poly 2 mask used according to the known art. In detail, with respect to the known art, the invention provides the removal of the dielectric layer on the memory cell after the deposition of the P+mask, so as to not remove simultaneously the layer of thermal oxide grown at the N-channel transistors to be formed in the substrate, so that this thermal oxide layer 119 subsequently screens the substrate during the successive etching of the first polysilicon layer for the definition of the floating gate of the memory cells.

As can be observed from the preceding description, the invention therefore achieves the intended aim and objects. In fact, though a reduction of one masking step is achieved, the method according to the invention entails no increase in any other process steps, since three oxide etchings (including the ONO etching) and two polysilicon etchings are performed in the known method in the steps illustrated in FIGS. 14–19, exactly as according to the invention, including the etching of the gate oxide before the S/D implantation of arsenic shown in FIG. 22, while if this last oxide etching is not performed the process is simplified even further.

The invention thus conceived is susceptible to numerous modifications and variations, all of which are within the scope of the inventive concept. In particular the fact is stressed that the thickness of the first polysilicon layer 124 may be selected greater than the indicated value (as is currently used). In fact in some cases problems may arise in the step shown in FIG. 21 during the implantation of boron, since the layer formed by 1500 Å of polysilicon 124 and by 500 Å of ONO 126 has the minimum thickness which blocks the S/D boron implantation. Consequently it is possible to increase the thickness of the first polysilicon layer 124 from the current 1500Å to 1800–2000 Å which ensure a safe blocking of the indicated boron implantation. In that case it is possible to provide a second option, according to which it is possible to move perform the etching of the ONO layer 126 before the S/D boron implantation, if this is thought to be advantageous. By providing the first polysilicon layer 124 with the indicated increased thickness, it is possible to execute the reoxidation step after all the implantations for the obtainment of the source and drain regions of all the transistors, or after the removal of the masking resist layer 31 (for the definition of the gate regions of the CMOS transistors and the control gates of the memory cells, in which case the deposition of the masking resist 135 directly onto the bare silicon is avoided.

Further, as indicated, the etching of the gate oxide (thermal oxide 119 of the memory cells) may be performed or not performed, since the arsenic can be implanted through the oxide, in particular when the reoxidation is performed before the S/D implantation of arsenic for the obtainment of the source-drain regions with N-type conductivity.

The indicated process can furthermore be employed for and EPROM CMOS process, with or without Double-Shorted-Poly, with or without drain extension and with any type of dielectric between the two polysilicon layers of the memory cells, since these conditions relate to the process steps which are common to the known process.

Furthermore, though the illustrated example relates to a structure provided in an epitaxial substrate with N-type conductivity, the process is also applicable to devices provided in substrates with opposite-type conductivity and opposite zones.

Finally, all the details may be replaced with other technically equivalent elements.

I claim:

1. A method for manufacturing in a substrate an EPROM memory cell having self-aligned floating and control gates and a pair of complementary MOS transistors, comprising, in sequence, the steps of:

forming an oxide layer on the surface of said substrate, depositing a first polysilicon layer on said oxide layer at least at the substrate region wherein the memory cell is to be formed, forming a dielectric material layer at least over said polysilicon layer, depositing a second polysilicon layer shaping said second polysilicon layer to form the control gate of said memory cell and the gate regions of said CMOS transistors, selectively introducing first doping impurities into said substrate to form source and drain regions of a first transistor of said pair of complementary MOS transistors, said memory cell being masked by said dielectric material layer or by said first polysilicon layer, removing said dielectric material layer except under said control gate of said memory cell, removing said first polysilicon layer, except under said control gate of said memory cell, thereby shaping said floating gate of said memory cell, selectively introducing second doping impurities into said substrate to form source and drain regions of a second transistor of said pair of complementary MOS transistors and source and drain regions of the memory cell.

2. A method for manufacturing in a substrate an EPROM memory cell having self-aligned floating and control gates and a pair of complementary MOS transistors, comprising, in sequence, the steps of:

forming an oxide layer on the surface of said substrate, depositing a first polysilicon layer on said oxide layer at least at the substrate region wherein the memory cell is to be formed, forming a dielectric material layer at least over said first polysilicon layer, depositing a second polysilicon layer, shaping said second polysilicon layer to form the control gate of said memory cell and the gate regions of said CMOS transistors, depositing a first mask having windows at the region of said substrate at which the memory cell is to be formed and at the portion of said substrate at which a first transistor of the pair of complementary MOS transistors is to be formed, selectively introducing first doping impurities into said substrate to form source and drain regions of said first transistor, selectively removing uncovered portions of said dielectric material layer, removing said first mask, depositing a second mask having windows at the region of said substrate where the memory cell is to be formed and at a second portion of said substrate at which a second transistor of the pair of complementary MOS transistors is to be formed, removing uncovered portions of said first polysilicon layer, thereby shaping said floating gate of said memory cell, selectively introducing second doping impurities into said substrate to form source and drain regions of said second transistor and of the memory cell, removing said second mask.

3. A method for manufacturing CMOS EPROM memory cells in a substrate of semiconductor material having a first conductivity type, defining at least one memory portion and one driving portion, wherein said memory portion accommodates a plurality of active memory regions at which memory cells are to be formed having an upper and a lower gate regions of polycrystalline semiconductor material which are mutually superimposed and electrically insulated from each other, and said driving portion comprises active drive regions at which CMOS transistors are to be formed including a pair of complementary MOS transistors each having source, drain and gate regions, said active drive regions including zones having a second conductivity type, substantially opposite to said first conductivity type, the method comprising, in sequence the steps of:

forming an oxide layer on the surface of said substrate, depositing a first layer of polycrystalline semiconductor material on said oxide layer at least at said active memory regions, forming a dielectric material layer at least over said first layer of polycrystalline semiconductor material, depositing a second layer of polycrystalline semiconductor material, masking said second layer of polycrystalline semiconductor material by means of a first mask covering the gate regions of the memory cells and of the CMOS transistors, removing uncovered portions of said second layer of polycrystalline semiconductor material to form the upper gate regions of said memory cells and the gate regions of said CMOS transistors, removing said first mask, selectively masking the active driving regions by means of a second mask having windows at the active memory regions and at first portions of the active driving regions at which a first transistor of each pair of complementary transistors is to be formed, introducing first doping impurities into said substrate at said first portions of the active driving regions for forming source and drain regions of said first transistors, said active memory regions being screened at least by said dielectric material layer, selectively removing said dielectric material layer of said active memory regions except at the gate regions of the memory cells, removing said second mask, selectively masking the active driving regions by means of a third mask having windows at the active memory regions and at second portions of the active driving regions at which a second transistor of each pair of complementary transistors is to be formed, removing said first layer of polycrystalline semiconductor material at the active memory regions except at the gate regions of said memory cells, thereby shaping said lower gate regions of said memory cells, introducing second doping impurities into said substrate at said second portions of the active driving regions and at said active memory regions to form source and drain regions of said second transistors and of the memory cells, removing said third mask.

4. A method according to claim 3, wherein drain-extension doping impurities are selectively introduced in said substrate after said step of removing uncovered portions of said second layer of polycrystalline semiconductor layer.

5. A method according to claim 3, wherein drain-extension doping impurities are selectively introduced in said substrate after said step of removing said second mask.

6. A method according to claim 3, wherein drain-extension doping impurities are selectively introduced in said substrate after said step of removing said third mask.

7. A method according to claim 3, wherein said first layer of polycrystalline semiconductor material and said dielectric material layer are deposited on the entire surface of said substrate and said dielectric material layer is selectively removed from the active driving regions before said step of depositing said second layer of polycrystalline semiconductor layer.

8. A method according to claim 3, wherein said oxide layer is selectively removed from the active memory regions and from the second portions of the active driving regions before said step of removing said first layer of polycrystalline semiconductor material.

9. A method according to claim 3, wherein a further oxide layer is formed after said step of depositing a second layer of polycrystalline semiconductor layer and said further oxide layer is selectively removed before said step of removing uncovered portions of said second polycrystalline semiconductor material, said further oxide layer being screened by said first mask, the remaining portions of said further oxide layer screening said gate regions of the memory cells and complemetary transistors during said step of removing said first layer of polycrystalline semiconductor material.

10. A method according to claim 9, wherein said further oxide layer is vapor-phase oxide.

11. A method according to claim 3, wherein said step of forming a dielectric material layer comprises oxidating the surface of said first layer of polycrystalline semiconductor layer, depositing a nitride layer and oxidating said nitride layer.

12. A method for manufacturing in a substrate an EPROM memory cell having self-aligned floating and control gates and a pair of complementary MOS transistors, comprising the steps of:

forming an oxide layer on the surface of said substrate, depositing a first polysilicon layer on said oxide layer at least at the substrate region wherein the memory cell is to be formed, forming a dielectric material layer at least over said first polysilicon layer, depositing a second polysilicon layer, shaping said second polysilicon layer to form the control gate of said memory cell and the gate regions of said CMOS transistors, depositing a first mask having windows at the region of said substrate at which the memory cell is to be formed and at the portion of said substrate at which a first transistor of the pair of complementary MOS transistors is to be formed, selectively introducing first doping impurities into said substrate to form source and drain regions of said first transistor, said memory cell being thereby masked by said first polysilicon layer and/or by said dielectric material, a second transistor of said pair of complementary MOS transistors being thereby masked by said first mask, selectively removing uncovered portions of said dielectric material layer, removing said mask, depositing a second mask having windows at the region of said substrate where the memory cell is to be formed and at a second portion of said substrate at which said second transistor of the pair of complementary MOS transistors is to be formed, removing uncovered portions of said first polysilicon layer, thereby shaping said floating gate of said memory cell, selectively introducing second doping impurities into said substrate to form source and drain regions of said second transistor and of the memory cell, said first transistor being thereby masked by said second mask, removing said second mask.

13. A method for manufacturing CMOS EPROM memory cells in a substrate of semiconductor material having a first conductivity type, defining at least one memory portion and one driving portion, wherein said memory portion accommodates a plurality of active memory regions at which memory cells are to be formed having an upper and a lower gate regions of polycrystalline semiconductor material which are mutually superimposed and electrically insulated from each other, and said driving portion comprises active drive regions at which CMOS transistors are to be formed including a pair of complementary MOS transistors each having source, drain and gate regions, said active drive regions including zones having a second conductivity type, substantially opposite to said first conductivity type, the method comprising the steps of:

forming an oxide layer on the surface of said substrate, depositing a first layer of polycrystalline semiconductor material on said oxide layer at least at said active memory regions, forming a dielectric material layer at least over said first layer of polycrystalline semiconductor material, depositing a second layer of polycrystalline semiconductor material, masking said second layer of polycrystalline semiconductor material by means of a first mask covering the gate regions of the memory cells and of the CMOS transistors, removing uncovered portions of said second layer of polycrystalline semiconductor material to form the upper gate regions of said memory cells and the gate regions of said CMOS transistors, removing said first mask, selectively masking the active driving regions by means of a second mask having windows at the active memory regions and at first portions of the active driving regions at which a first transistor of each pair of complementary transistors is to be formed, introducing first doping impurities into said substrate at said first portions of the active driving regions for forming source and drain regions of said first transistors, said active memory regions being thereby masked at least by said dielectric material layer and/or by said first polycrystalline semiconductor layer, a second transistor of each pair of said complementary transistors being thereby masked by said second mask, selectively removing said dielectric material layer of said active memory regions except at the gate regions of the memory cells, removing said second mask, selectively masking the active regions by means of a third mask having windows at the active memory regions at second portions of the active driving regions at which said second transistor of each pair of complementary transistors is to be formed, removing said first layer of polycrystalline semiconductor material at the active memory regions except at the gate regions of said memory cells, thereby shaping said lower gate regions of said memory cells, introducing second doping impurities into said substrate at said second portions of the active driving regions and at said active memory regions to form source and drain regions of said second transistors and of the memory cells, said first transistor being thereby masked by said third mask, removing said third mask.

14. A method according to claim 13, wherein said step of selectively removing said dielectric material layer is performed before said step of introducing first doping impurities into said substrate.

* * * * *